United States Patent
Johnson et al.

(10) Patent No.: US 8,268,727 B2
(45) Date of Patent: Sep. 18, 2012

(54) METHODS FOR FABRICATING FINFET SEMICONDUCTOR DEVICES USING PLANARIZED SPACERS

(75) Inventors: Frank S. Johnson, Wappinger Falls, NY (US); Douglas Bonser, Hopewell Junction, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 434 days.

(21) Appl. No.: 12/426,827

(22) Filed: Apr. 20, 2009

(65) Prior Publication Data

US 2010/0267238 A1 Oct. 21, 2010

(51) Int. Cl.
*H01L 21/302* (2006.01)

(52) U.S. Cl. .......... 438/692; 438/717; 438/696

(58) Field of Classification Search .......... 438/947
See application file for complete search history.

(56) References Cited

U.S. PATENT DOCUMENTS 5,328,810 A * 7/1994 Lowrey et al. ................ 430/313
7,268,054 B2 * 9/2007 Tran et al. ..................... 438/401

* cited by examiner

*Primary Examiner* — Binh X Tran
*Assistant Examiner* — David Cathey, Jr.
(74) *Attorney, Agent, or Firm* — Ingrassia Fisher & Lorenz, P.C.

(57) ABSTRACT

Methods of fabricating a semiconductor device on and in a semiconductor substrate are provided. In accordance with an exemplary embodiment of the invention, one method comprises forming a sacrificial mandrel overlying the substrate, wherein the sacrificial mandrel has sidewalls. Sidewall spacers are formed adjacent the sidewalls of the sacrificial mandrel, the sidewall spacers having an upper portion and a lower portion. The upper portion of the sidewall spacers is removed. The sacrificial mandrel is removed and the semiconductor substrate is etched using the lower portion of the sidewall spacers as an etch mask.

20 Claims, 2 Drawing Sheets

METHODS FOR FABRICATING FINFET SEMICONDUCTOR DEVICES USING PLANARIZED SPACERS

FIELD OF THE INVENTION

The present invention generally relates to methods for fabricating semiconductor devices, and more particularly relates to methods for fabricating FinFET semiconductor devices using planarized spacers.

BACKGROUND OF THE INVENTION

Transistors, such as metal oxide semiconductor field-effect transistors (MOSFETs), are the core building blocks of the vast majority of semiconductor devices. Some semiconductor devices, such as high performance processor devices, can include millions of transistors. For transistors having a planar architecture and a single gate electrode, decreasing transistor size has traditionally been the primary means of achieving higher device densities with ever increasing numbers of transistors on a single device chip.

Transistors having a non-planar architecture and more than one gate electrode have also been investigated as a means of increasing device density. A FinFET is a type of non-planar transistor that has one or more conductive fins that are raised above the surface of a substrate and extend between a source and drain region acting as a channel for the device. The fins may be fabricated using a procedure that includes the formation of thin sidewall spacers adjacent the sidewalls of larger, sacrificial features called "mandrels." These spacers are formed by an anisotropic etch of a blanket-coated and conformal, generally dielectric, layer overlying the mandrel. Following formation of the spacers, the sacrificial mandrels are selectively removed leaving the sidewall spacers remaining. These spacers then are used as etch masks for pattern transferring into the substrate to form fins. Because sidewall spacers are formed by an anisotropic etch along the sidewall of a substantially straight-walled mandrel, they typically have one substantially straight and vertical sidewall (the side adjacent the mandrel) and one contoured sidewall (the sidewall away from the mandrel). The contoured sidewall is typically characterized by a rounded and sloping upper portion that often terminates with a facet and/or a point. The rounded/faceted profile of spacers can be undesirable because the final fin structure may assume a similar non-rectangular profile that mimics the spacer as a result of the pattern transfer process. Because the gate of a FinFET device is also a raised structure that conformally wraps about the fin, such rounding or faceting of the fin adversely affects the length and shape of the channel resulting in inconsistent performance in these devices.

Because spacers are formed on the sidewalls of a mechanically more robust mandrel, they can be formed with a smaller base dimension and a larger aspect ratio (ratio of feature height to smallest base width) than would be possible using conventional lithographic means. However, the high aspect ratio makes spacers more fragile and susceptible to defect formation due to spacer collapse during processing. Wet etchants, often preferable for their high selectivity in removing certain mandrel materials, generate considerable viscous and capillary forces that tend to exacerbate such collapse creating yet more defects.

Accordingly, it is desirable to provide methods for fabricating FinFET transistor devices using planarized spacers having a more rectangular profile and a reduced aspect ratio that result in improved fin profiles and fewer defects. Further, other desirable features and characteristics of the present invention will become apparent from the subsequent detailed description of the invention and the appended claims, taken in conjunction with the accompanying drawings and this background of the invention.

BRIEF SUMMARY OF THE INVENTION

Methods of fabricating a semiconductor device on and in a semiconductor substrate are provided. In accordance with exemplary embodiments of the invention, one method comprises forming a sacrificial mandrel overlying the substrate, wherein the sacrificial mandrel has sidewalls. Sidewall spacers are formed adjacent the sidewalls of the sacrificial mandrel, the sidewall spacers having an upper portion and a lower portion. The upper portion of the sidewall spacers is removed. The sacrificial mandrel is removed and the semiconductor substrate is etched using the lower portion of the sidewall spacers as an etch mask.

In accordance with a further exemplary embodiment of the invention, a further method for fabricating a semiconductor device on and in a semiconductor substrate is provided. The method comprises the steps of forming a sacrificial mandrel overlying the substrate, wherein the sacrificial mandrel has sidewalls. Sidewall spacers are formed adjacent the sidewalls of the sacrificial mandrel, wherein the sidewall spacers have an upper portion and a lower portion. The sidewall spacers and the sacrificial mandrel are planarized with a chemical mechanical planarization process that removes the upper portion. The sacrificial mandrel is removed and the semiconductor substrate is etched using the lower portion of the sidewall spacers as an etch mask.

In accordance with yet another exemplary embodiment of the invention, another method for fabricating a semiconductor device on and in a semiconductor substrate having a surface is provided. The method comprises the steps of forming a sacrificial mandrel overlying the surface of the substrate wherein the sacrificial mandrel has sidewalls. Sidewall spacers are formed adjacent the sidewalls of the sacrificial mandrel, with the sidewall spacers having an upper portion and a lower portion. A planarizing layer is deposited overlying the surface of the substrate, the sacrificial mandrel, and the sidewall spacers. The sacrificial mandrel, the sidewall spacers, and the planarizing layer are etched at substantially the same rate until the upper portion is removed. The planarizing layer and the sacrificial mandrel are removed, and the semiconductor substrate is etched using the lower portion of the sidewall spacers as an etch mask

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

The various embodiments of the present invention provide methods for fabricating FinFET transistors using planarized spacers for the formation of fin structures. The planarizing process reduces the aspect ratio and improves the profile of spacers used as etch masks by removing the upper, more rounded/faceted portion of these spacers. The lower aspect ratio lessens the tendency for spacers to collapse during processing, thus avoiding the creation of defects. The more rectangular spacer profile results in a more symmetric and right angular fin profile leading to enhanced device performance. In one exemplary embodiment, following the formation of sacrificial mandrels and sidewall spacers, a chemical mechanical planarization (CMP) process is used to remove upper portions of the mandrel and spacers including the region of the spacers having a sloping or faceted sidewall. The mandrel remains in place to provide physical support to the spacers during the CMP process which is controllably terminated when a predetermined amount of the spacer and mandrel are removed. In another exemplary embodiment, mandrels and spacers are covered by a deposited planarizing layer that is then etched along with the mandrels and spacers at a substantially even removal rate until the predetermined amount of spacer and mandrel is removed. The presence of the planarizing layer along the outer sidewall of the spacers provides protection from further erosion of the spacer sidewall that would otherwise propagate the rounded/faceted profile to the final truncated and planarized spacer.

FIGS. 1-6 illustrate schematically, in cross-section, methods for fabricating a FinFET semiconductor device using planarized spacers, in accordance with a first exemplary embodiment of the invention. While the fabrication of portions of one FinFET transistor is illustrated, it will be appreciated that the method depicted in FIGS. 1-6 can be used to fabricate any number of such transistors. Various steps in the manufacture of semiconductor device components are well known and so, in the interest of brevity, many conventional steps will only be mentioned briefly herein or will be omitted entirely without providing the well known process details.

Figure 1:
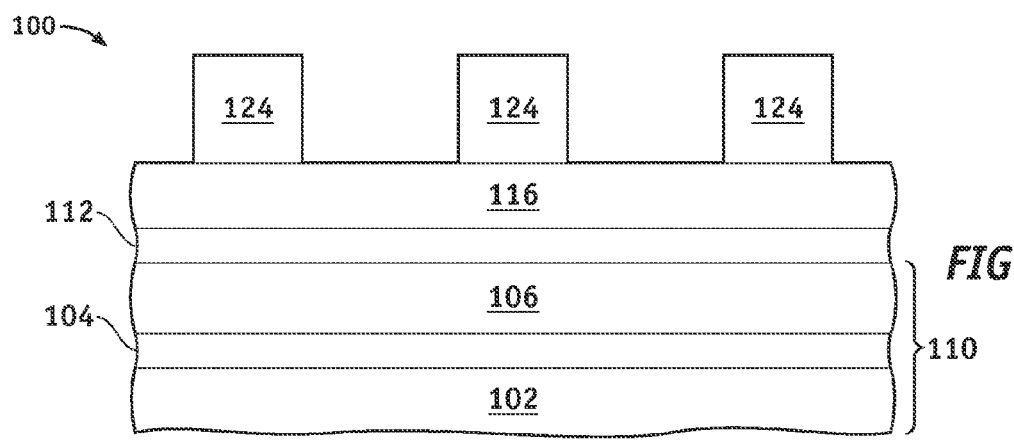
FIGS. 1-6 illustrate schematically, in cross-section, methods for fabricating a FinFET semiconductor device using planarized spacers in accordance with exemplary embodiments of the present invention.

Referring to FIG. 1, the method begins by providing a semiconductor substrate 110 on and in which FinFET semiconductor device 100 will subsequently be formed. The semiconductor substrate can be silicon, germanium, a III-V material such as gallium arsenide, or other semiconductor material. Semiconductor substrate 110 may also include one or more layers, such as insulating layers, polycrystalline silicon, or the like, overlying the semiconductor material. Semiconductor substrate 110 will hereinafter be referred to for convenience, but without limitation, as a silicon substrate. The term "silicon substrate" is used herein to encompass the relatively pure silicon materials typically used in the semiconductor industry as well as silicon admixed with other elements such as germanium, carbon, and the like. The silicon substrate may be a bulk silicon wafer or, as illustrated, may be a thin layer of silicon 106 on an insulating layer 104 (commonly know as silicon-on-insulator, or SOI) that, in turn, is supported by a carrier wafer 102.

The method continues with the deposition of various layers, to be described in detail below, that are used for the formation of sacrificial mandrels and sidewall spacers formed adjacent the sidewalls of these mandrels. Material composition for mandrels and spacers may be selected to provide a convenient and precise means of controlling the amount of sidewall spacer removed by either the CMP or etch planarizing processes. Such control can be achieved by adjusting these processes to remove one material type from another selectively, or in a manner that removes the first material substantially faster than a second material. For example, mandrels composed of two layers of differing compositions may be used with a CMP or etch process adjusted to selectively remove only the upper layer along with a corresponding portion of the spacer having the undesirable rounded/faceted profile. In such a scenario, the removal process stops or significantly slows when the lower layer is reached. The thickness of the lower mandrel layer can thus be used to establish the final height of the planarized spacers. Material for the lower mandrel layer and the spacers may also be selected such that mandrels are removed from spacers with high selectivity so that further erosion of the spacer, along with an associated degradation in profile, is avoided.

In accordance with one embodiment, a mandrel layer 112 is formed overlying silicon layer 106. Mandrel layer 112 may comprise a deposited silicon oxide, silicon nitride, or silicon oxynitride, polycrystalline silicon, amorphous silicon, amorphous carbon (a-C), a carbon-doped silica (SiCOH), or another material suitable for providing mechanical support for sidewall spacers to be formed in a manner described in detail below. Mandrel layer 112 may be blanket-deposited using, for example, a plasma enhanced chemical vapor deposition (PECVD), low pressure chemical vapor deposition (LPCVD), or chemical vapor deposition (CVD) process. Preferably mandrel layer 112 comprises silicon, a-C, or SiCOH having a thickness in a range of from about 50 nanometers (nm) to about 1 micron (μm), and is preferably about 100 nm to about 250 nm thick. In the case that mandrel layer 112 is used as a means of defining the height of subsequently formed sidewall spacers, the choice of thickness for layer 112 will depend upon the selectivity of the subsequently performed etch process that uses spacers as hard masks to form fins, and the desired fin height.

A mandrel layer 116 is formed overlying mandrel layer 112. Mandrel layer 116 can be formed using a deposition process described above with reference to mandrel layer 112, but has a composition different from that of layer 112. As will be described in greater detail below, mandrel layer 116 will be removed along with an upper portion of subsequently formed sidewall spacers and therefore may be composed of either the same material as that chosen for these spacers, or may be composed of a material having a removal rate substantially the same as that of the spacers. In one embodiment, mandrel layer 116 is a deposited silicon oxide having a thickness of from about 50 nm to about 500 nm. In a preferred embodiment, the thickness of layer 116 is between about 100 nm and about 250 nm. A suitable patterned soft mask 124 then is formed overlying mandrel layer 116 using a conventional photoresist and lithography process.

Figure 2:
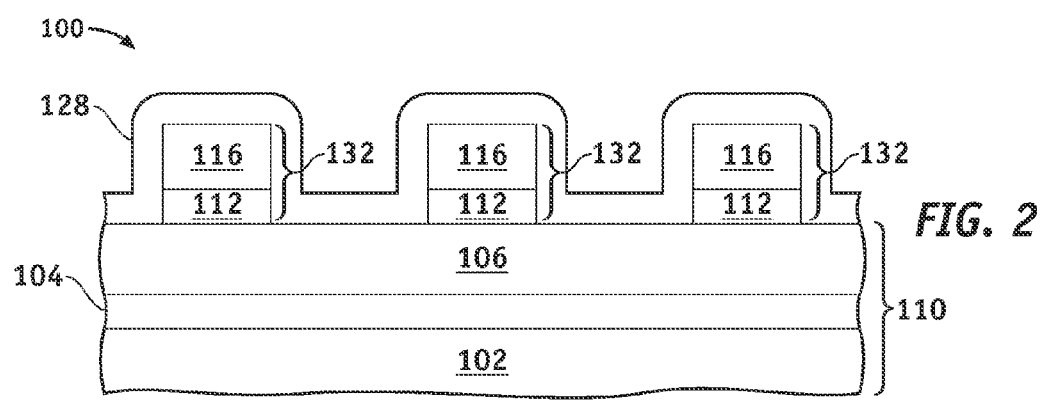
Figure 3:
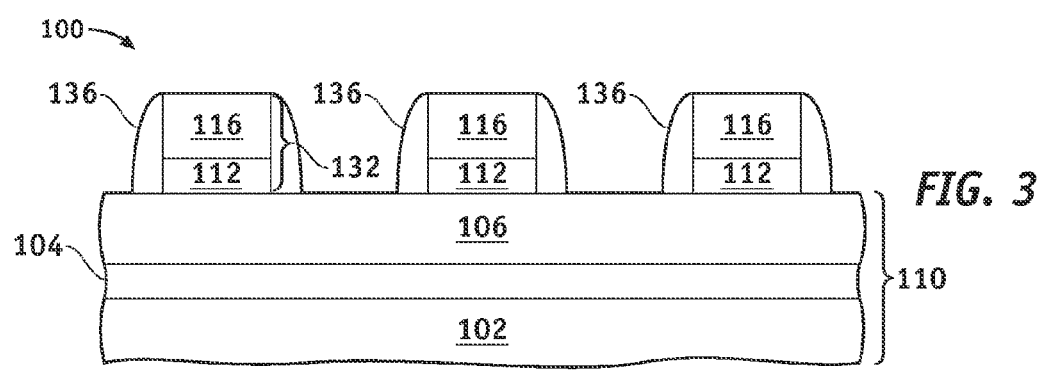

Mandrel layer 112 and mandrel layer 116 are anisotropically etched using soft mask 124 as an etch mask to form sacrificial mandrels 132, as illustrated in FIG. 2. Depending on the selectivity of this etch, a hard mask layer (not shown) may be interposed between mandrel layer 116 and soft mask 124 and patterned using mask 124. The hard mask may then be used alone or in conjunction with mask 124 as a mask for etching of mandrel layers 112 and 116. This etch may be performed by, for example, plasma or reactive ion etching (RIE) using chemistries based upon carbon trifluoride/oxygen ($CHF_3/O_2$) to etch silicon nitride, and $CHF_3$ or carbon tetrafluoride ($CF_4$) to etch silicon oxide or oxynitride, ozone ($O_3$), $O_2$, ammonia ($NH_3$) to etch a-C, hydrogen bromide/oxygen ($HBr/O_2$) to etch silicon, or octafluorocyclobutane ($C_4F_8$) and $CF_4$ to etch SiCOH. Next, a sidewall spacer layer 128 comprising a dielectric material such as, for example, a silicon nitride or a silicon oxide is conformally blanket-deposited overlying the surface of device 100 including sacrificial mandrels 132. Sidewall spacer layer 128 may be deposited in a manner described above with reference to mandrel layer 112. Preferably, the composition of sidewall spacer layer 128 is chosen such that mandrel layer 112 may be selectively removed by a subsequent etch process without subjecting layer 128 to further erosion. For example, if mandrel layer 112 is formed of a silicon nitride, sidewall spacer layer 128 may be formed of a silicon oxide since mandrel layer 112 may be selectively removed using a heated phosphoric acid/water ($H_3PO_4/H_2O$) solution. Sidewall spacer layer 128 has a thickness of from about 100 nm to about 1 µm and will depend, at least in part, on the desired critical dimension (CD) of the final fin structure. The method continues with the anisotropic etch of sidewall spacer layer 128 to form sidewall spacers 136 adjacent to the sidewalls of sacrificial mandrels 132, as illustrated in FIG. 3. This etch may be performed using the etch processes described above for etching of mandrel layers 112 and 116.

Figure 4:
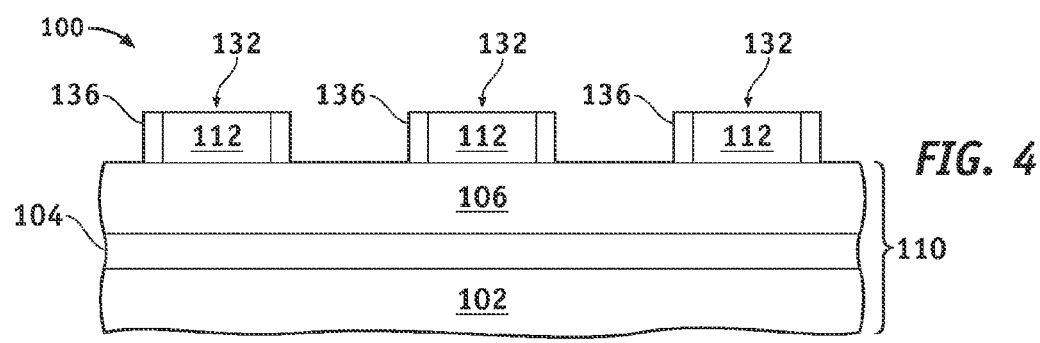

In one exemplary embodiment, mandrels 132 and sidewall spacers 136 are planarized by removal of mandrel layer 116 and an upper portion of sidewall spacers 136 using a suitable CMP process, as illustrated in FIG. 4. The CMP process is adjusted so that the removal rate of layer 116 and spacers 136 is significantly greater than the removal rate of mandrel layer 112 causing the process preferably to stop on, or remove only negligible amounts of, layer 112. Many varied combinations of materials for mandrel layers 112 and 116 and sidewall spacer layer 128 may be used to facilitate the selectivity of the CMP process. For example, mandrel layer 116 and sidewall spacers 136 may each comprise a silicon oxide, while mandrel layer 112 comprises a silicon nitride. In this case, the CMP process is adjusted, for example, by additions of dilute hydrofluoric acid (HF) to the CMP slurry so that the removal rate of silicon oxide greatly exceeds that of silicon nitride. The CMP process also removes the upper portion of spacers 136 including the portion having a sloped, faceted, and/or pointed end. The remaining lower portion of spacers 136 has a substantially rectangular cross-sectional shape featuring substantially right angular corners and a planarized top surface.

Figure 5:
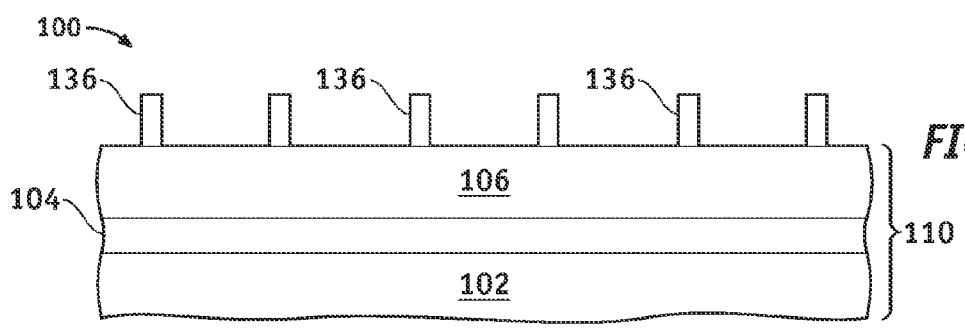
Figure 6:
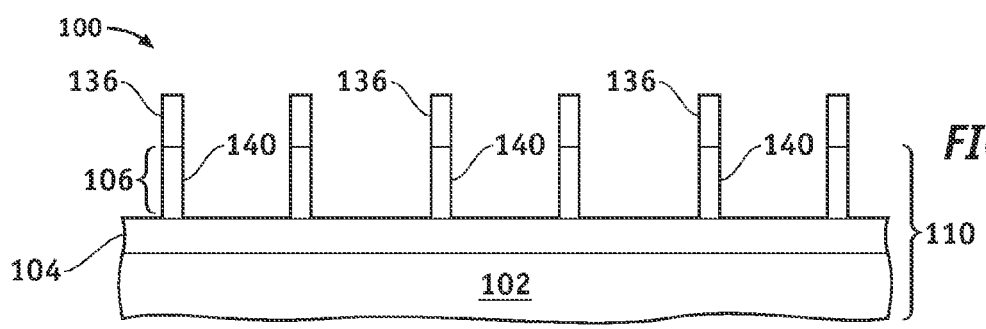

Following the planarization process, mandrel layer 112 is selectively removed using a dry or preferably wet etch process so as to minimize further erosion of spacers 136, as illustrated in FIG. 5. In the case wherein mandrel layer 112 is a silicon nitride and spacers 136 are a silicon oxide, a heated $H_3PO_4/H_2O$ solution may be used. If these materials are reversed, a suitable $HF/H_2O$ solution may be used to selectively remove layer 112. Because the height and thus the aspect ratio of spacers 136 has been reduced by the planarization process, a wet etchant is much less likely to cause the collapse of spacers due to viscous and/or capillary forces, and cause defects thereby. Alternatively, for the case wherein spacers 136 are either a silicon nitride or a silicon oxide, and layer 112 is a-C, a dry, $O_2$-based ashing process may be used to selectively remove layer 112 from spacers 136. Following removal of mandrel layer 112, sidewall spacers 136, now planarized, may be used as etch masks for the formation of fin structures 140 etched into thin silicon layer 106 to insulating layer 104 as required for fabrication of FinFET device 100, as illustrated in FIG. 6. Any remainder of spacers 136 then may be removed using any suitable wet or dry etch process selective to spacers 136 to avoid erosion of fin structures 140.

Figure 7:
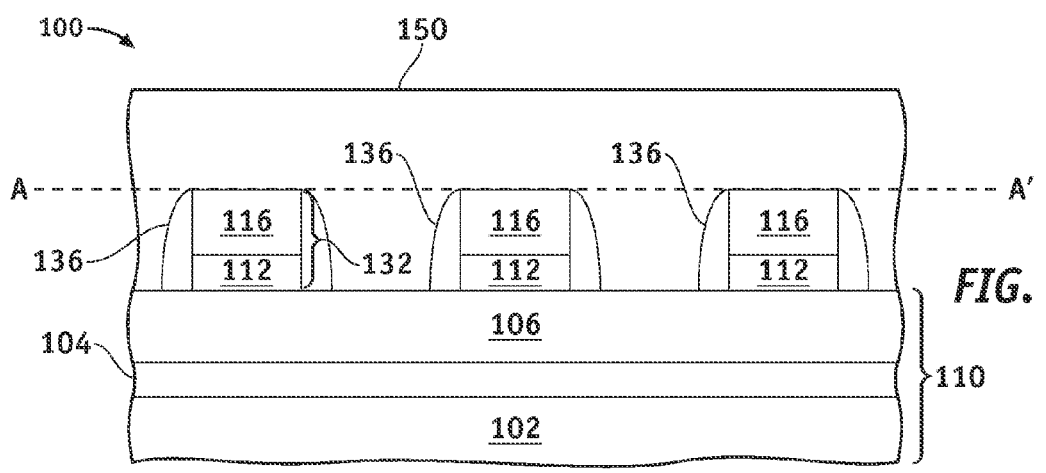
FIGS. 7-8 in conjunction with FIGS. 1-3 and FIGS. 5-6, illustrate schematically, in cross-section, methods for fabricating a FinFET semiconductor device using planarized spacers in accordance with other exemplary embodiments.
Figure 8:
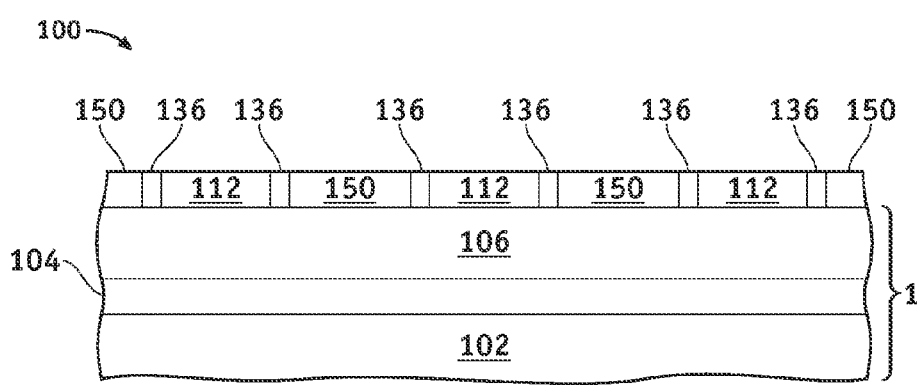

In another exemplary embodiment illustrated in FIGS. 7-8, sacrificial mandrels 132 and sidewall spacers 136 are planarized using a protective planarizing layer in conjunction with a wet or dry etch process. This method begins with steps that are illustrated in FIGS. 1-3 and previously described. Following the formation of sidewall spacers 136 adjacent mandrels 132 illustrated in FIG. 3, the method continues with the deposition of a planarizing layer 150 overlying the surface of thin silicon layer 106 including mandrels 132 and sidewall spacers 136, as illustrated in FIG. 7. Planarizing layer 150 may comprise any organic or inorganic material, and may be deposited using any suitable deposition technique that results in a film having a substantially planar surface. In one embodiment, planarizing layer 150 is an organic material such as, for example, a photoresist sensitized for a particular wavelength or range of wavelengths of light, a polyimide such as, for example, (poly)methylglutarimide (PMGI; available from MicroChem. Corp., Newton, Mass.), or the like dissolved in a suitable solvent. For such materials, layer 150 may be deposited, for example, using a spin coating and post-application bake sequence. In another embodiment, planarizing layer 150 may comprise a silicon-comprising monomer or polymer also similarly solvated and depositable via spin-coating. In a further embodiment, planarizing layer 150 may be a silicon-comprising spin-on-glass (SOG) material also deposited from a solvent solution. Such silicon-comprising materials may be preferable compared to those not containing silicon because of the additional etch resistance silicon imparts to such materials. Further, silicon-comprising materials may be etched at a rate that more closely approximates that of spacers 136 and/or mandrel layer 116, especially when these components comprise a silicon oxide.

Referring to FIG. 7, planarizing layer 150 is reduced in thickness using a suitable wet or dry etch process until the thickness of layer 150 is substantially equal that of mandrels 132 and spacers 136, represented by dotted line A-A'. Next, planarizing layer 150, mandrels 132, and sidewall spacers 136, are etched at a substantially uniform rate until the desired amount of spacers 136 is removed, as illustrated in FIG. 8. This etch is preferably done anisotropically, but need not be provided the etch rates for all materials are substantially the same. If spacers 136 and mandrel layer 116 both comprise a silicon oxide, and planarizing layer 150 comprises a silicon-containing material, an etch chemistry suitable for etching of silicon oxide as described above may be used and modified as necessary so that the etch rate for each of these three elements is approximately the same. In another example, if mandrel layer 116 comprises a silicon oxide and spacers 136 comprise a silicon nitride, $CHF_3$ or difluoroethylene ($CH_2F_2$) and/or $O_2$ may be included in the gas mixture as needed as a means of adjusting the relative etch rate of the silicon oxide to the nitride. By etching all materials at substantially the same rate, layer 150 protects the outer sidewall (sidewall away from sacrificial mandrels 132) of sidewall spacers 136 from erosion. Such erosion might otherwise propagate the sloped/faceted profile, characteristic of the upper portion of these spacers, to the lower portion. Accordingly, the more desirable rectangular profile, characteristic of the lower portion of spacers 136, is preserved for subsequent use as a hard mask for fin formation. In one embodiment, mandrel layer 112 comprises either amorphous or polycrystalline silicon or SiCOH, mandrel layer 116 comprises a silicon oxide, and spacers 136 comprise a silicon nitride and the etch process is adjusted such that layer 116 and spacers 136 are each removed with high selectivity to layer 112. Accordingly, the rate of etching is significantly reduced when layer 112 is reached. Control of such an etch process may be achieved by etching at a known removal rate for a specified time interval, enabling a convenient method by which the height of spacers 136 may be controlled. Alternatively, if applicable based upon the materials used for mandrel layers 112 and 116, optical emission spectral (OES) endpoint detection may be used as a means to terminate the etch process by signaling the emergence of layer 112.

In an embodiment (not illustrated) applicable to both CMP and etch-based planarization processes, sacrificial mandrels 132 are formed as a single-layer structure with a thickness based upon considerations previously described, comprising only mandrel layer 112. In this case, CMP or dry etching processes may be adjusted to remove layer 112 and spacers 136 (and planarizing layer 150 if an etch-based process is used) at a predetermined rate, and operated in a timed manner such that the height of these features is trimmed by the desired amount.

Next, mandrel layer 112 and the remainder of planarizing layer 150 are removed, as illustrated in FIG. 5. Layers 112 and 150 may be removed using suitable wet or dry etch processes highly selective to these layers such that erosion to the remaining planarized portion of sidewall spacers 136 is minimized. Planarizing layer 150 may be removed using conventional solvent-based stripping and/or oxygen-based plasma ashing processes suited to the removal of organic layers, if applicable. Wet etchants used for the removal of mandrel layer 112 may include dilute HF and heated $H_3PO_4$ solutions with water for etching silicon oxides and silicon nitrides, respectively. Following the removal of mandrel layer 112 and planarizing layer 150, sidewall spacers 136 then are used as etch masks for forming fin structures as previously described and illustrated in FIG. 6. Any remainder of spacers 136 may then be removed using a suitable selective wet or dry etch.

Accordingly, methods have been provided for the fabrication of FinFET transistor devices using planarized sidewall spacers. These spacers are formed adjacent to the sidewalls of sacrificial mandrels and are planarized by removal of an upper portion typically characterized by a rounded, and/or faceted profile. Planarization of the spacers also reduces the aspect ratio of these features and thus highly selective wet etchants may be used for mandrel removal without degrading the desirable rectangular profile of the spacer and without forming defects from spacer collapse. Accordingly, fabrication of FinFET transistors having fin structures with improved profiles is enabled via a processing sequence that generates fewer defects and that may be easily incorporated into a typical semiconductor fabrication line.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method of fabricating a semiconductor device on and in a semiconductor substrate, the method comprising the steps of:

forming a sacrificial mandrel overlying the substrate, the sacrificial mandrel having sidewalls;

forming sidewall spacers adjacent the sidewalls of the sacrificial mandrel, the sidewall spacers having a rounded and sloping upper portion and a lower portion having a substantially rectangular cross-sectional shape;

removing the upper portion of the sidewall spacers to leave only the lower portion of the sidewall spacers having the substantially rectangular shape;

removing the sacrificial mandrel; and etching the semiconductor substrate using the lower portion of the sidewall spacers as an etch mask.

2. The method of claim 1, wherein the step of removing the upper portion comprises removing the upper portion using a CMP process.

3. The method of claim 1, wherein the step of removing the upper portion comprises removing the upper portion using an etch process.

4. The method of claim 1, wherein the sidewall spacers and the sacrificial mandrel have a first thickness, further comprising the step of:

depositing a planarizing layer overlying the substrate, the sacrificial mandrel, and the sidewall spacers, the planarizing layer having a second thickness greater than the first thickness; and etching the planarizing layer back to substantially the first thickness.

5. The method of claim 4, further comprising the step of etching the planarizing layer, the upper portion of the sidewall spacers, and the sacrificial mandrel at substantially the same rate.

6. The method of claim 4, further comprising the step of removing the planarizing layer.

7. The method of claim 4, wherein the step of depositing a planarizing layer comprises depositing a silicon-comprising planarizing layer.

8. The method of claim 4, wherein the step of forming a sacrificial mandrel comprises:

forming a first mandrel layer overlying the substrate;

forming a second mandrel layer overlying the first mandrel layer, wherein the first and second mandrel layers have different compositions; and etching the first and second mandrel layers to form the sacrificial mandrel.

9. The method of claim 8, wherein the step of forming sidewall spacers and the step of forming a second mandrel layer comprise forming sidewall spacers and forming a second mandrel layer having the same composition.

10. The method of claim 8, further comprising the step of etching the planarizing layer, the upper portion of the sidewall spacers, and the second mandrel layer at substantially the same rate.

11. The method of claim 10, wherein the step of etching the planarizing layer, the upper portion of the sidewall spacers, and the second mandrel layer further comprises etching the planarizing layer, the upper portion of the sidewall spacers, and the second mandrel layer selectively from the first mandrel layer.

12. A method of fabricating a semiconductor device on and in a semiconductor substrate, the method comprising the steps of:

forming a sacrificial mandrel overlying the substrate, the sacrificial mandrel having sidewalls;

forming sidewall spacers adjacent the sidewalls of the sacrificial mandrel, the sidewall spacers having a rounded and sloping upper portion and a lower portion having a substantially rectangular cross-sectional shape;

reducing the aspect ratio of the sidewall spacers with a chemical mechanical planarization process that removes the upper portion to leave only the lower portion of the sidewall spacers having the substantially rectangular shape;

removing the sacrificial mandrel; and etching the semiconductor substrate using the lower portion of the sidewall spacers as an etch mask.

13. The method of claim 12, wherein the step of forming a sacrificial mandrel comprises:

forming a first mandrel layer overlying the substrate;

forming a second mandrel layer overlying the first mandrel layer, wherein the first and second mandrel layers have different compositions; and etching the first and second mandrel layers to form the sacrificial mandrel.

14. The method of claim 13, wherein the step of reducing comprises the step of removing the second mandrel layer selectively from the first mandrel layer.

15. The method of claim 13, wherein the step of forming sidewall spacers and the step of forming a second mandrel layer comprise forming sidewall spacers and forming a second mandrel layer having the same composition.

16. A method of fabricating a semiconductor device on and in a semiconductor substrate, the substrate having a surface, the method comprising the steps of:

forming a sacrificial mandrel overlying the surface of the substrate, the sacrificial mandrel having sidewalls;

forming sidewall spacers adjacent the sidewalls of the sacrificial mandrel, the sidewall spacers having a rounded and sloping upper portion and a lower portion having a substantially rectangular cross-sectional shape;

depositing a planarizing layer overlying the surface of the substrate, the sacrificial mandrel, and the sidewall spacers;

etching the sacrificial mandrel, the sidewall spacers, and the planarizing layer at substantially the same rate until the upper portion of the sidewall spacers is removed to leave only the lower portion of the sidewall spacers having the substantially rectangular shape;

removing the planarizing layer;

removing the sacrificial mandrel; and etching the semiconductor substrate using the lower portion of the sidewall spacers as an etch mask.

17. The method of claim 16, wherein the step of depositing a planarizing layer comprises depositing a silicon-comprising planarizing layer.

18. The method of claim 16, wherein the step of forming a sacrificial mandrel comprises:

forming a first mandrel layer overlying the substrate;

forming a second mandrel layer overlying the first mandrel layer, wherein the first and second mandrel layers have different compositions; and etching the first and second mandrel layers to form the sacrificial mandrel.

19. The method of claim 18, wherein the step of etching the sacrificial mandrel comprises etching the sacrificial mandrel until the upper portion is removed and such that the second mandrel layer is selectively removed from the first mandrel layer.

20. The method of claim 18, wherein the step of forming sidewall spacers and the step of forming a second mandrel layer comprise forming sidewall spacers and forming a second mandrel layer having the same composition.

* * * * *